United States Patent
Huang et al.

(10) Patent No.: US 6,724,634 B2
(45) Date of Patent: Apr. 20, 2004

(54) FIXTURE DEVICE FOR MOTHERBOARD MODULE

(75) Inventors: Kuo-Chin Huang, Hsin-Chu (TW); Kuan-Chou Ko, Hsin-Chu (TW)

(73) Assignee: Coretronic Corporation, Hsin-Chu (TW);

(*) Notice: Subject to any disclaimer, the term of this patent is extended or adjusted under 35 U.S.C. 154(b) by 0 days.

(21) Appl. No.: 10/248,277

(22) Filed: Jan. 6, 2003

(65) Prior Publication Data

US 2003/0133271 A1 Jul. 17, 2003

(30) Foreign Application Priority Data

Jan. 11, 2002 (TW) ...................................... 91200481 U

(51) Int. Cl.[7] .............................. H05K 5/00; H05K 5/04; H05K 5/06
(52) U.S. Cl. .................. 361/732; 361/728; 361/740; 361/741; 361/747; 361/756; 361/759; 361/801; 361/802
(58) Field of Search ................................ 361/724–728, 361/732, 740–741, 747, 752, 756, 759, 801–802, 807, 683, 731, 753, 804, 808–809, 825, 829, 778, 768–769, 820, 711, 719–720, 735, 785, 790; 439/328, 357, 358

(56) References Cited

U.S. PATENT DOCUMENTS 6,480,393 B1 * 11/2002 Chen .......................... 361/759
6,485,322 B1 * 11/2002 Branch et al. .............. 439/357

* cited by examiner

Primary Examiner—Phuong T. Vu
(74) Attorney, Agent, or Firm—Winston Hsu

(57) ABSTRACT

The invention is related to a fixture device for motherboard module by placing two fixing plates on the locational surface of a major control device. A Π-shaped slide way with the same width as the motherboard module is formed on the base plate below the fixing plate. Additionally, a locating button in front of the opening of the slide way is used to secure the motherboard module into the slide way. Through this approach, the motherboard module can be easily installed/disassembled by pressing the locating button without using any tools or test fixtures.

5 Claims, 5 Drawing Sheets

FIXTURE DEVICE FOR MOTHERBOARD MODULE

BACKGROUND OF INVENTION

1. Field of the Invention

The present invention relates to a display device, and more particularly, to a slide way mounting for fixing a motherboard module of the display device.

2. Description of the Prior Art

As high-tech industries progress in the recent years, development of related products is also growing at a fast pace in order to meet various commercial demands. The research direction of these products has gradually shifted towards developing additional functions; thus, many additional devices along with free I/O ports are integrated into the products. At the same time, products have to meet the trend of being light-weighted and slim in order to fit into the limited space. For example, a display device is largely occupied by a projection system within; it is difficult to fit any additional devices in the already narrow space. Problem such as this and difficulty in installation/repair have become an important research topic in the industries.

Please refer to FIG. 1 for a display device according to prior art. The display device 1 comprises a display panel 11 on the front of a base 10. The display panel 11 is connected to a screen 12 which has a projection system 13 on the back of the screen 12. Specifically, the projection system 13 is situated on top of a rear case 14 which behind the base 10. Included on the base plate 17 of the rear case 14 is a major control device 15 with its backside fixed to a motherboard module 16.

A schematic diagram of the fixed motherboard module 16 in the display device 1 is shown in FIG. 2. In the display device 1, multiple screw holes (not shown) are drilled at suitable locations on the side of the major control device 15 and the base plate 17. Corresponding screw holes (not shown) are also drilled on the protruding plate 161 in the motherboard module 16. Screws 162 are then fastened through the protruding plate 161 onto the side of the major control device 15 and the base plate 17. This allows the motherboard module 16 to be fixed on the base plate 17. However, when additional devices are closely connected to the rear case 14, it is fairly difficult to perform installation/disassembly with a screwdriver since there is little room left for the maneuver. During after-sales services in particular, one often has to rely on experience and sense of touch because vision is easily impaired by the small amount of space in the rear case 14. It not only takes more time to fasten the screws but reduces efficiency in installation or repair. Consequently, simple and speedy installation/disassembly could not be achieved in this kind of prior art.

SUMMARY OF INVENTION

It is an object of the present invention to provide a fixture device with slide way for a motherboard module. This allows quick and precise mounting of the motherboard module to the base plate, increasing the overall efficiency in installation or repair.

Another objective of the invention is to provide a fixture device with a type of fixing plate and locating button for a motherboard module. In this case, the motherboard module can be easily mounted in the least amount of time without using much test fixtures.

In order to meet the above objectives, the fixture device for motherboard module by placing two fixing plates on the locational surface of a major control device. A Π-shaped slide with the same width as the motherboard module is formed on the base plate below the fixing plate. Additionally, a locating button in front of the opening of the slide way is used to secure the motherboard module into the slide way. Through this approach, the motherboard module can be easily installed/disassembled by pressing the locating button without using any tools or test fixtures.

DETAILED DESCRIPTION

A preferred embodiment of the present invention will be explained with reference to the accompanying drawings.

Figure 1:
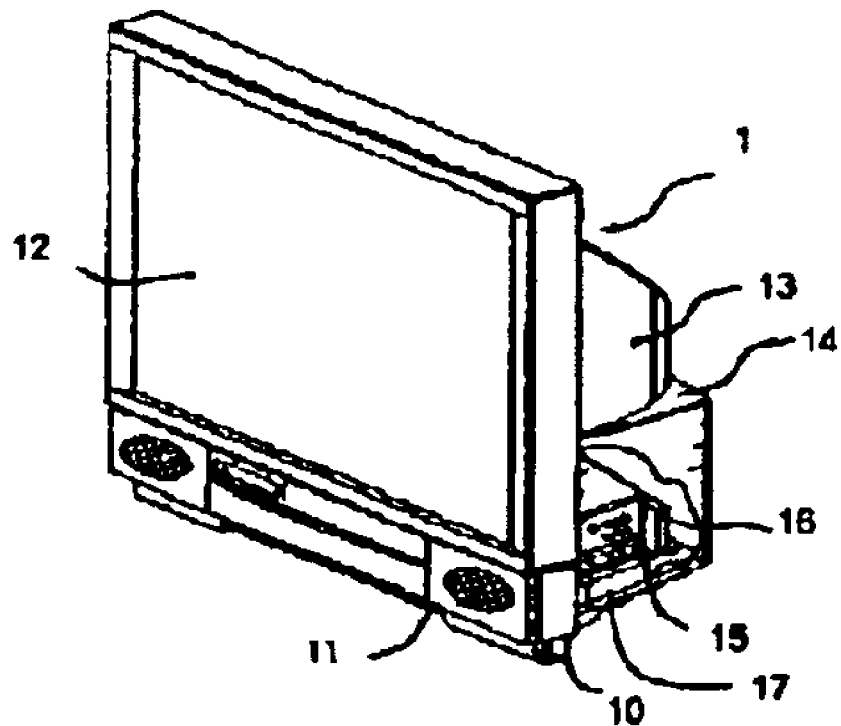
FIG. 1 is a perspective view of a display device according to the prior art.
Figure 2:
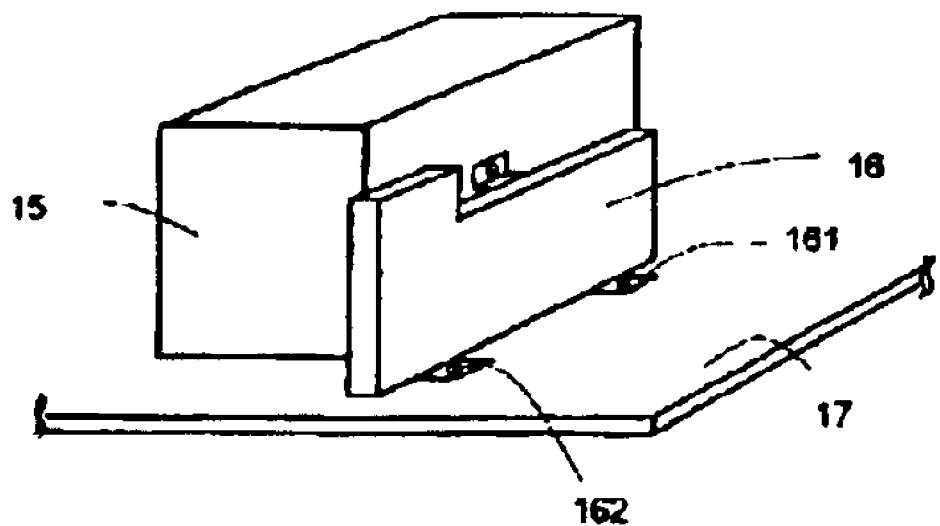
FIG. 2 is a schematic diagram of the fixture device for the motherboard module according to the prior art.
Figure 3:
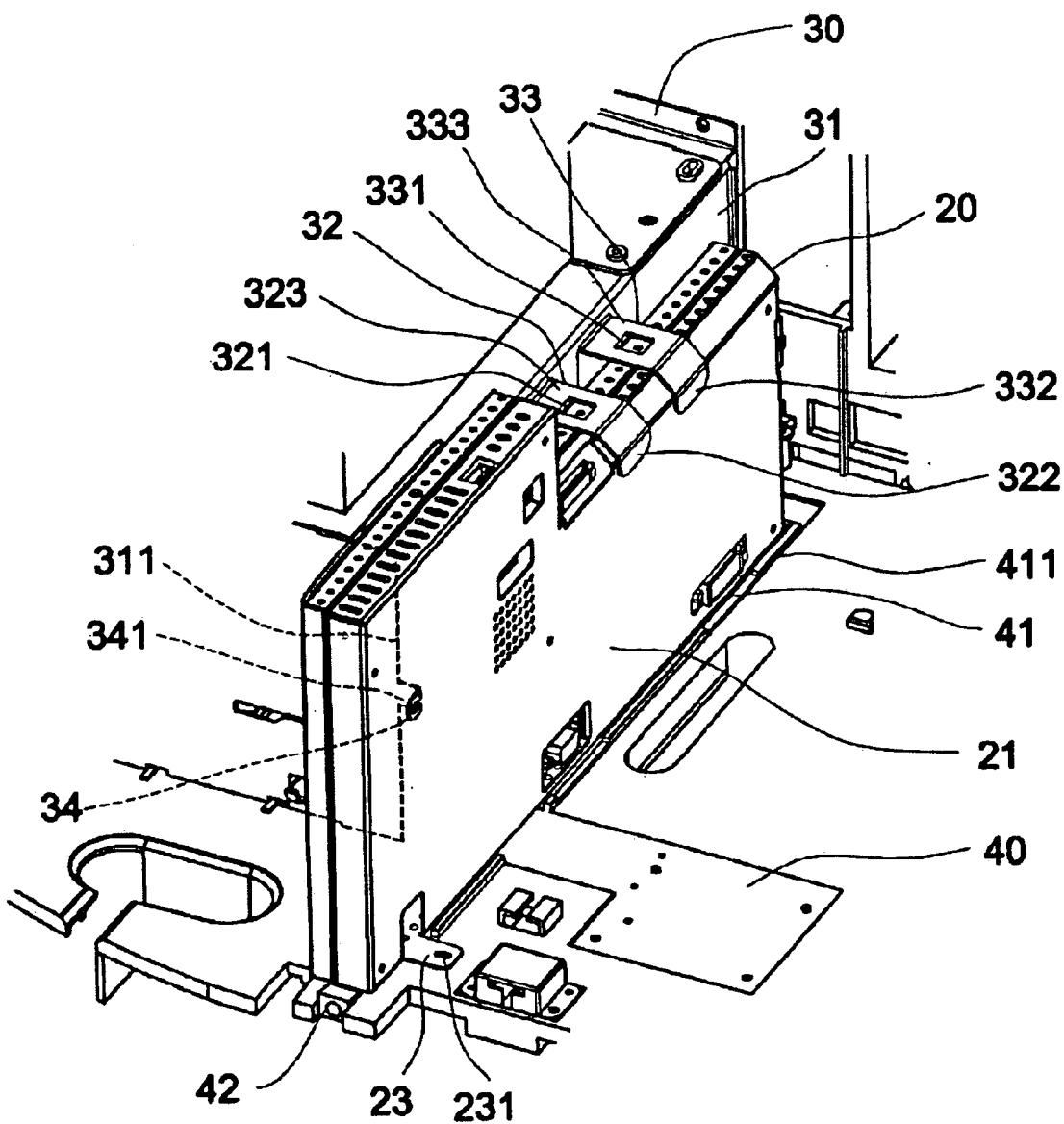
FIG. 3 is a perspective view of the motherboard module mounted to the fixture device according to the present invention.

Please refer to FIG. 3, the fixture device, used in motherboard module 20, which installed two fixing plates 32 on the locational surface 31 of the major control device 30. A slide way 41 with the same width as the motherboard module 20 is formed on the base plate 40 just below the fixing plates 32, 33. Furthermore, a locating button 42 is added on the edge of the base plate 40 in front of the slide way 41 to lock the motherboard module 20 in the slide way 41.

Figure 4:
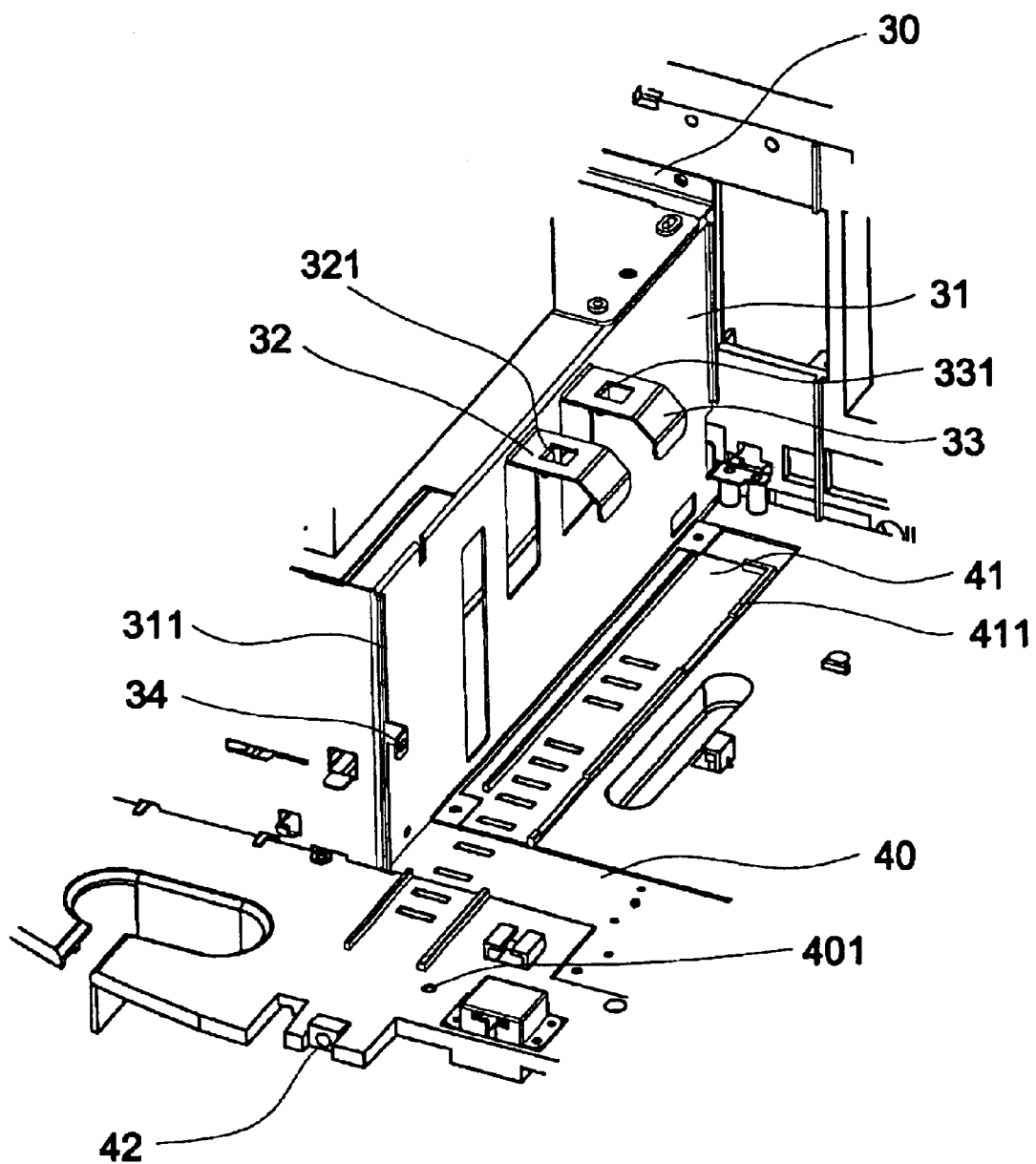
FIG. 4 is a perspective view of the fixture device for motherboard module.

As shown in FIG. 4, the fixing plates 32, 33 are placed separately in a certain distance on the locational surface 31 of the major control device 30 with roughly the same height as the motherboard module 20. The L-shaped fixing plates 32, 33 are fixed on the locational surface 31 on one end and protruded perpendicularly to the locational surface 31 on the other end with the edge bended vertically according to the shape of the top end of the motherboard module 20. The bended edge forms tightening sections 322, 332 which perpendicular to the base plate 40. On the other hand, two plane sections 323, 333 also has holders 321, 331 in the center and perpendicular to the base plate 40. The horizontal distance between the holders 321, 331 and the tightening sections 322, 332 is equal to the top width of the motherboard module 20 for securing the two top sides of the motherboard module 20. Furthermore, a guider 34 is placed near the center of the front edge 311 of the locational surface 31. The guider 34 protrudes outward from the front edge 311 of the locational surface 31 and after a horizontal distance equal to the distance between the holders 321, 331 and the locational surface 31, it bends parallel to the front edge of the locational surface 31 to form a guiding surface.

Figure 5:
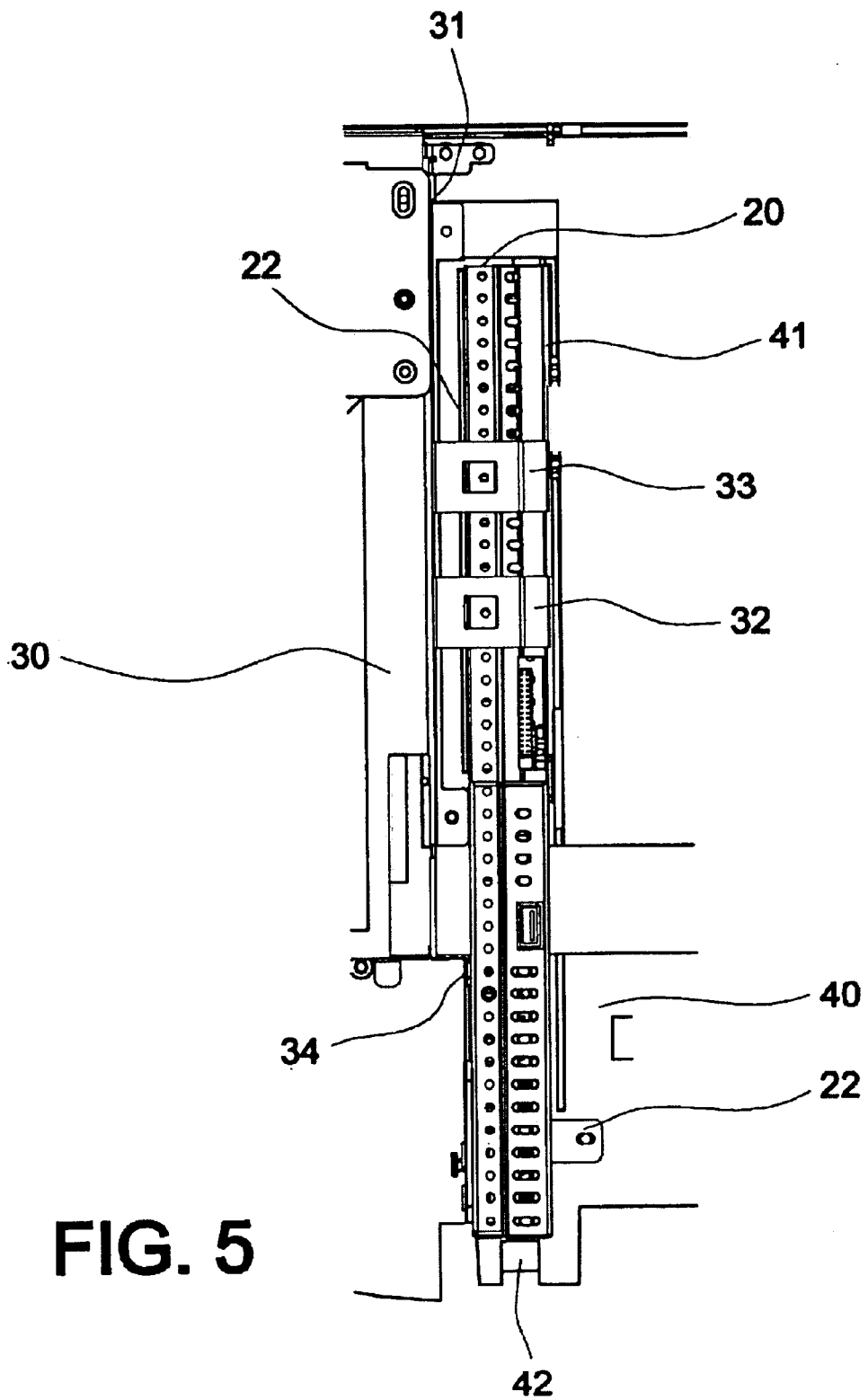
FIG. 5 is a top view of the fixture device for motherboard module.

In addition, as shown in FIG. 5, the slide way 41 of the fixture device 20 is a Π-shaped slide way with its opening towards the front of the locational surface 31 and parallel to the side of the surface 31 on the base plate 40 with a sidewall 411. The width of the slide way 41 is roughly equal to the lower width of the motherboard module 20 and the length is at least a half of the motherboard module 20. The horizontal distance between the locational surface 31 and the side wall 411 is equal to the horizontal distance between the holders 321, 331 and the locational surface 31. Furthermore, a locating button 42 is formed as a whole with the base plate 40 and is formed near the opening of the slide way 41 wherein the locating button 42 protrudes from the surface of the base plate 40 to the edge of the base plate 40 with two sides separated from the base plate 40 for pressing to lower the base plate 40. The distance of the locating button 42 protrudes from the surface of the base plate 40 to the end of the slide way 41 is equal to the lower length of the motherboard module 20. The restricted space between the side wall 411 of the slide way 41 and the locating button 42 fixes the lower surface of the motherboard module 20.

When used, the implementation of the fixture device for the motherboard module 20 allows the lower surface of the motherboard module 20 to be placed into the slide way 41 and moved on the sides by the guider 34 by pushing the fixing plates 32, 33 between the holders 321, 331 and the tightening sections 322, 332. The motherboard module 20 can be pushed further until the side wall 411 on the end of the slide way 41 is reached and until the entire locating button 42 protrudes from the base plate 40. At this time, the three edges of the lower surface of the motherboard module 20 sinks into the Π-shaped slide way 41 created by the side wall 411 while the lower front edge of the motherboard module 20 gets locked by the locating button 42. Also, restricted by the holders 321, 331 of the fixing plates 32, 33 which made by the metal or elastic objects and the tightening sections 322, 332 along with the guider 34 on the sides, the motherboard module 20 is firmly fixed on the base plate 40. When disassembling, the locating button 42 is pressed down to the same level as the base plate 40 and the motherboard module 20 can be retrieved. Therefore, this invention is able to achieve easy and speedy installation/disassembly without the use of any tools or test fixtures.

Additionally, in order to make the motherboard module 20 more stable, a screw hole 341 can also be drilled through the surface on the guider 34 and corresponding position (not shown) on the inner side 22 of the motherboard module 20. Then, a fastening piece 23 with a screw hole 231 can fix the motherboard module 20 in place through other screw holes 341, 231 to the corresponding position 401 on the base plate 40. Since the screw holes are near the front edge of the motherboard module 20, clear visibility and sufficient space reduce the difficultly in installation/disassembly.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. A fixture device for a motherboard module comprising:

a base plate;

a locating button on the edge of the base plate;

a Π-shaped slide way formed by a side wall on the base plate with an opening facing the locating button;

a locational surface which is on the side of the slide way and perpendicular to the base plate; at least one fixing plate which is placed above the slide way and attached on the locational surface, wherein one end of the fixing plate is fixed on the locational surface and protruded perpendicularly to the locational surface to form a plane section with a holder, the other end being bent down as a tightening section; and a motherboard module which has a top surface and a lower surface, the lower surface being fixed by a restricted space formed by the slide way and the locating button, the top surface being secured between the holder and the tightening section.

2. The fixture device for a motherboard module of claim 1, wherein the locating button protrudes from the surface of the base plate to the edge of the base plate with two sides separated from the base plate for pressing to lower the base plate.

3. The fixture device for a motherboard module of claim 2, wherein the locating button is formed as a whole with the base plate.

4. The fixture device for a motherboard module of claim 1, wherein the tightening section of the fixing plate is bent down along the top surface of the motherboard module.

5. The fixture device for a motherboard module of claim 1, wherein the locational surface further comprises a guider which is placed in the front edge of the locational surface.

* * * * *